United States Patent
Baek et al.

(10) Patent No.: US 9,869,728 B2
(45) Date of Patent: Jan. 16, 2018

(54) SYNTHETIC TEST CIRCUIT FOR VALVE PERFORMANCE TEST OF HVDC

(71) Applicant: LSIS CO., LTD., Gyeonggi-do (KR)

(72) Inventors: Seung Taek Baek, Gyeonggi-do (KR); Eui Cheol Nho, Busan (KR); Jae Hun Jung, Busan (KR); Jin Hee Lee, Gyeonggi-do (KR); Yong Ho Chung, Gyeonggi-do (KR)

(73) Assignee: LSIS CO., LTD, Gyeonggi-Do (KR)

( * ) Notice: Subject to any disclaimer, the term of this patent is extended or adjusted under 35 U.S.C. 154(b) by 0 days.

(21) Appl. No.: 15/187,446

(22) Filed: Jun. 20, 2016

(65) Prior Publication Data

US 2016/0370437 A1      Dec. 22, 2016

(30) Foreign Application Priority Data

Jun. 18, 2015   (KR) .......................... 10-2015-0086910

(51) Int. Cl.
*G01R 31/40*      (2014.01)
*G01R 31/333*     (2006.01)

(52) U.S. Cl.
CPC ......... *G01R 31/40* (2013.01); *G01R 31/3336* (2013.01)

(58) Field of Classification Search
CPC ........ G01R 31/40; G01R 31/42; G01R 31/34; G01R 31/343; G01R 31/346
See application file for complete search history.

(56) References Cited

U.S. PATENT DOCUMENTS

| | | | | |
|---|---|---|---|---|
| 5,852,558 | A | * 12/1998 | Julian | ................. H02M 7/5387 363/132 |
| 2005/0284673 | A1 | * 12/2005 | Nakazawa | ............ H02M 7/483 180/65.1 |
| 2010/0206378 | A1 | 8/2010 | Erickson, Jr. et al. | |
| 2012/0112528 | A1 | * 5/2012 | Fassnacht | ........... B60L 11/1814 307/9.1 |

(Continued)

FOREIGN PATENT DOCUMENTS

| | | |
|---|---|---|
| CN | 102175942 A | 9/2011 |
| CN | 103197241 A | 7/2013 |
| KR | 10-2012-0025531 A | 3/2012 |

OTHER PUBLICATIONS

Extended European Search Report for Application No. EP16169381.7, dated Dec. 1, 2016, in 8 pages.

*Primary Examiner* — Tung X Nguyen
(74) *Attorney, Agent, or Firm* — K&L Gates LLP

(57) ABSTRACT

Embodiments of a synthetic test circuit for a valve performance test of high-voltage direct current (HVDC) are presented. In some embodiments, the synthetic test circuit comprises a resonance circuit configured to comprise a first test valve to test an operation of an inverter mode and a second test valve to test an operation of a rectifier mode. The synthetic test circuit may comprise a power supply (P/S) configured to provide the resonance circuit with an operating voltage. The synthetic test circuit may comprise a direct current/direct current (DC/DC) converter configured to bypass a DC offset current of the resonance circuit. The first test valve may be an inverter unit, which may have a positive DC current offset. Further, the second test valve may be a rectifier unit, which may have a negative DC current offset.

10 Claims, 10 Drawing Sheets

(56) References Cited

U.S. PATENT DOCUMENTS

2012/0257429 A1* 10/2012 Dong .................. H02M 3/1582
　　　　　　　　　　　　　　　　　　　　　　363/127
2013/0314111 A1　　11/2013　Baek et al.
2014/0198534 A1　　7/2014　Jovcic

* cited by examiner

Prior art

Prior art

Prior art

Prior art

Prior art

SYNTHETIC TEST CIRCUIT FOR VALVE PERFORMANCE TEST OF HVDC

CROSS REFERENCE TO RELATED APPLICATION

This application claims the benefit of Korean Patent Application No. 10-2015-0086910, filed on Jun. 18, 2015, which is hereby incorporated by reference in its entirety.

BACKGROUND

Technical Field

The present disclosure relates to a synthetic test circuit for a valve performance test of high-voltage direct current (HVDC). More particularly, the present disclosure relates to a synthetic test circuit which artificially applies current and voltage similar to those appearing at an IGBT (insulated-gate bipolar transistor) valve when an MMC (Modular Multilevel Converter) based voltage source HVDC operates normally and abnormally, to an IGBT valve module which is independent from a converter, capable of performing a variety of tests.

Description of the Related Art

FIG. 1 is a view illustrating an example of a synthetic test circuit for a valve performance test in the art.

A synthetic test circuit for a voltage source HVDC illustrated in FIG. 1 is configured of two (2) sets of test valves (Test valve 1 and Test valve 2) each including several sub-modules connected serially, a DC power source E to charge a capacitor of the test valve, two (2) auxiliary valves (Auxiliary valve 1 and Auxiliary valve 2) to supplement the loss occurred when operating the synthetic test circuit, two (2) auxiliary DC power sources (E1 and E2) to charge a capacitor of each auxiliary valve, and a reactor L serially connected between the test valves to simulate a pseudo-sinusoidal current flowing between valves when an MMC (Modular Multilevel Converter) actually operates.

A sub-module is configured of a capacitor and two (2) serially connected IGBTs, the capacitor and two IGBTs being connected in parallel. The first test valve and the second test valve each are configured of m serially connected sub-modules and n serially connected sub-modules. The auxiliary valves each are configured of one sub-module, and in order to charge the capacitor of the auxiliary valve, the each capacitor is in parallel connected to an auxiliary DC power source. The synthetic test circuit for a voltage source HVDC should be able to simulate a waveform of a current flowing through a sub-module when actually operating an MMC for the current flowing through the test valve, in the same manner. The system of FIG. 1 generates a pseudo-sinusoidal current waveform using a resonance of a capacitor of a test valve and an inductor located between respective test valves, and tests the test valve using the pseudo-sinusoidal current waveform.

FIGS. 2 to 4 are views illustrating operations of synthetic test circuits for a valve performance test in the art.

Referring to FIGS. 2 to 4, as illustrated in FIG. 2 first, after setting output voltages u1 and u2 of test valves that may generate a magnitude and a frequency of a current to be simulated in the synthetic test circuit, a capacitor of an auxiliary valve is charged using E1 and E2. Next, as illustrated in FIG. 3, after charging the capacitor of the test valve using E, all power sources are separated from the valves. Then, as illustrated in FIG. 4, using an output voltage of the test valve that is suitably generated, a current to be simulated is generated.

FIG. 5 is a view illustrating a configuration of a test valve, FIG. 6 is a view illustrating an output voltage of a test valve, FIG. 7 is a view illustrating an equivalent circuit of a synthetic test circuit, and FIG. 8 is a view illustrating a voltage of an inductor.

The principle to generate a current flowing through an actual test valve may be explained using a configuration of a test valve and an output voltage illustrated in FIGS. 5 and 6, an equivalent circuit of a synthetic test circuit illustrated in FIG. 7 and an inductor voltage $U_L$ illustrated in FIG. 8.

When suitably turning on or off each switch state of the test valve configured of m sub-modules illustrated in FIG. 5, 0 to $V_{SM11}*m[V]$ voltage may be generated as illustrated in FIG. 6. When serially connected sub-modules of the test valve are five (5) in number, an equivalent circuit of the synthetic test circuit may be indicated as illustrated in FIG. 7. Further, when a pseudo-sinusoidal voltage illustrated in FIG. 8 is applied to an inductor L located between the test valves by regulating a phase of u2, the current flowing through the reactor also may become a pseudo-sinusoidal wave. By doing that, it may be possible to enable a current whose type is similar to an AC component of the current flowing through the sub-module when actually operating the MMC, to flow through the test valve. However, there is a limitation that it is not possible to enable a DC component included on an actual MMC operation to flow.

The synthetic test circuit for a voltage source HVDC valve test is configured of two (2) test valves and two (2) auxiliary valves. The auxiliary valve serves to supplement the loss occurred in the test valve when operating the synthetic test circuit. While a sub-module capacitor and an auxiliary valve capacitor of the test valve should be charged before testing the test valve, there is a problem that a DC power source to charge the test valve and two DC power sources to charge an auxiliary valve are needed, that is, three (3) DC power sources are needed in total. Further, since a test current is generated using a resonance of a capacitor and an inductor of the test valve, there is a problem that it is not possible to generate a waveform of a pseudo-sinusoidal current including a DC offset current flowing through an individual sub-module when actually operating the MMC. Additionally, while the current flowing through each IGBT and diode has a PWM form when actually operating the MMC, there is a problem that such a current shape cannot be embodied.

SUMMARY

It is an objective of some embodiments of the present disclosure to provide a novel configuration of a synthetic test circuit for a valve performance test of HVDC.

It is another objective of some embodiments of the present disclosure to provide a synthetic test circuit for a valve performance test of HVDC, which is capable of providing a current including a DC offset.

It is yet another objective of some embodiments of the present disclosure to provide a configuration of a synthetic test circuit for a valve performance test of HVDC, which is capable of switching several times within a period.

It is still yet another objective of some embodiments of the present disclosure to provide a synthetic test circuit for a valve performance test of HVDC, which consumes a little power and is capable of simultaneously testing the specimen to be tested of an inverter unit and a rectifier unit.

According to an aspect of some embodiments of the present disclosure, there is provided a synthetic test circuit for a valve performance test of HVDC, including a resonance circuit configured to comprise a first test valve to test an operation of an inverter mode and a second test valve to test an operation of a rectifier mode; a power supply (P/S) configured to provide the resonance circuit with an operating voltage; and a DC/DC converter configured to bypass a DC offset current of the resonance circuit, wherein the first test valve is an inverter unit, which has a positive DC current offset, wherein the second test valve is a rectifier unit, which has a negative DC current offset.

BRIEF DESCRIPTION OF THE DRAWINGS

The above and other objects and features of the present disclosure will become apparent from the following description of embodiments given in conjunction with the accompanying drawings, in which.

DETAILED DESCRIPTION

Hereinafter, preferred embodiments of a synthetic test circuit for a valve performance test of HVDC will be described in detail with reference to the accompanying drawings.

Figure 1:
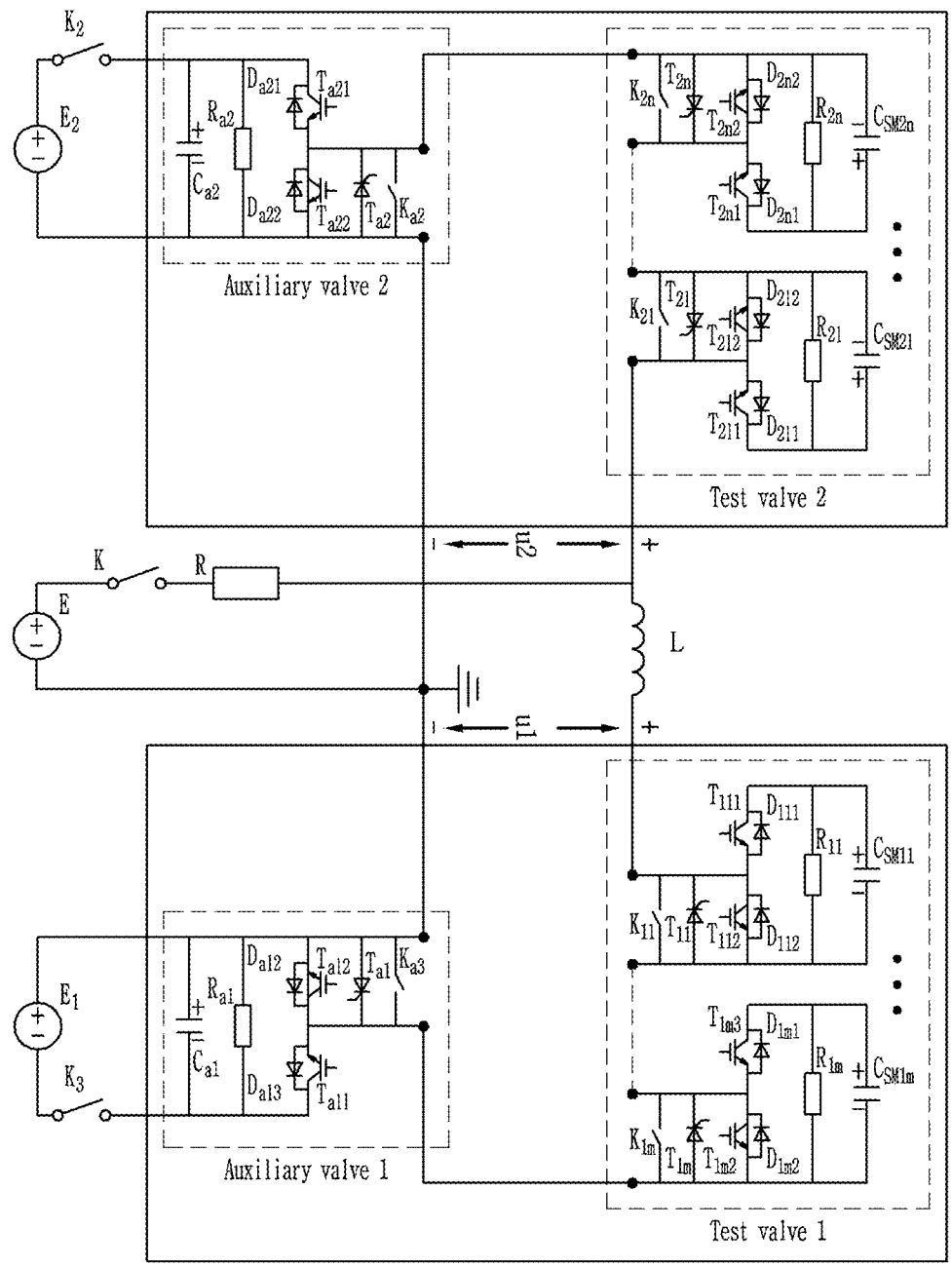
FIG. 1 is a view illustrating an example of a synthetic test circuit for a valve performance test, according to the prior art.
Figure 2:
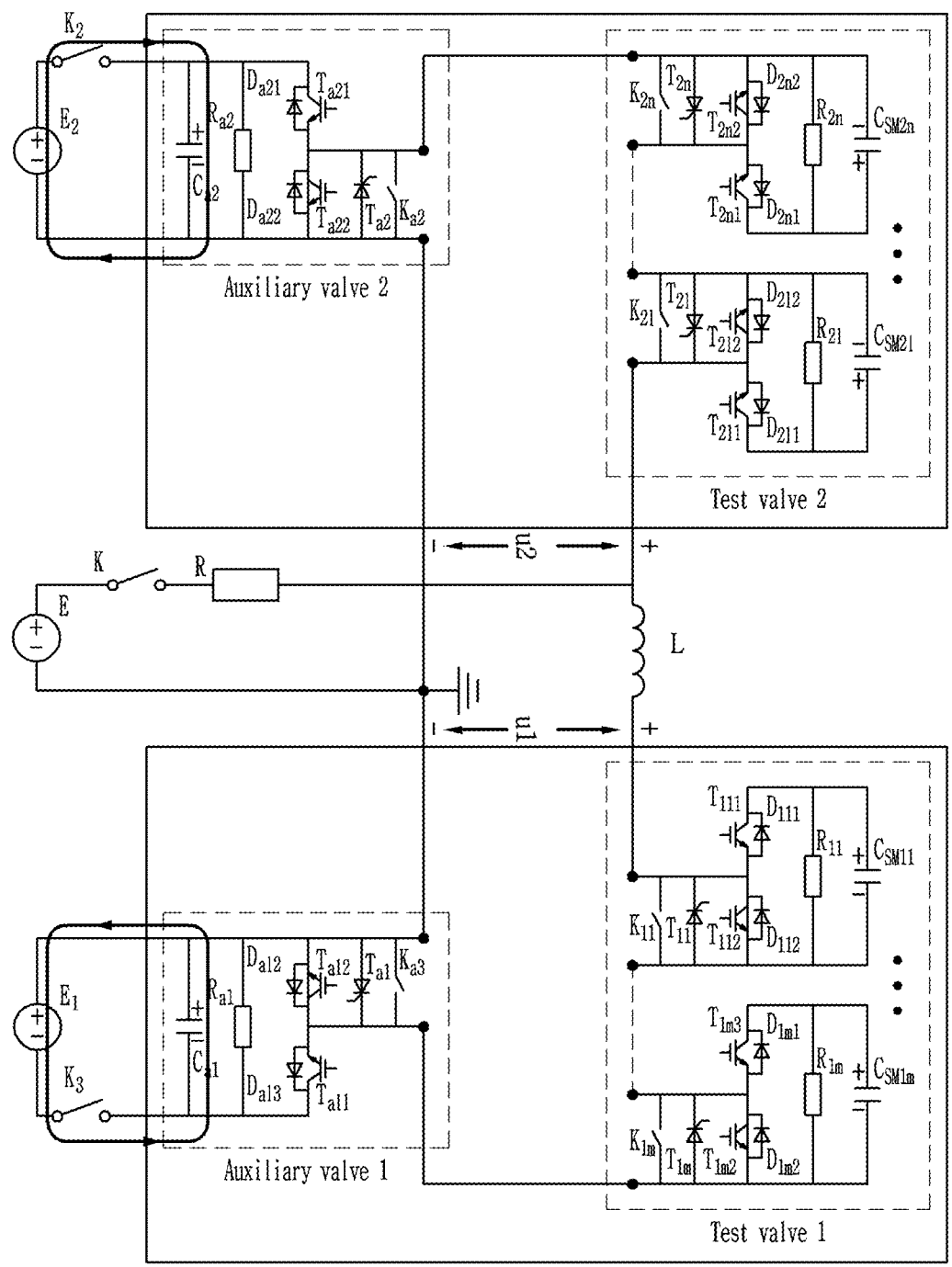
FIGS. 2 to 4 are views illustrating operations of synthetic test circuits for a valve performance test, according to the prior art.
Figure 3:
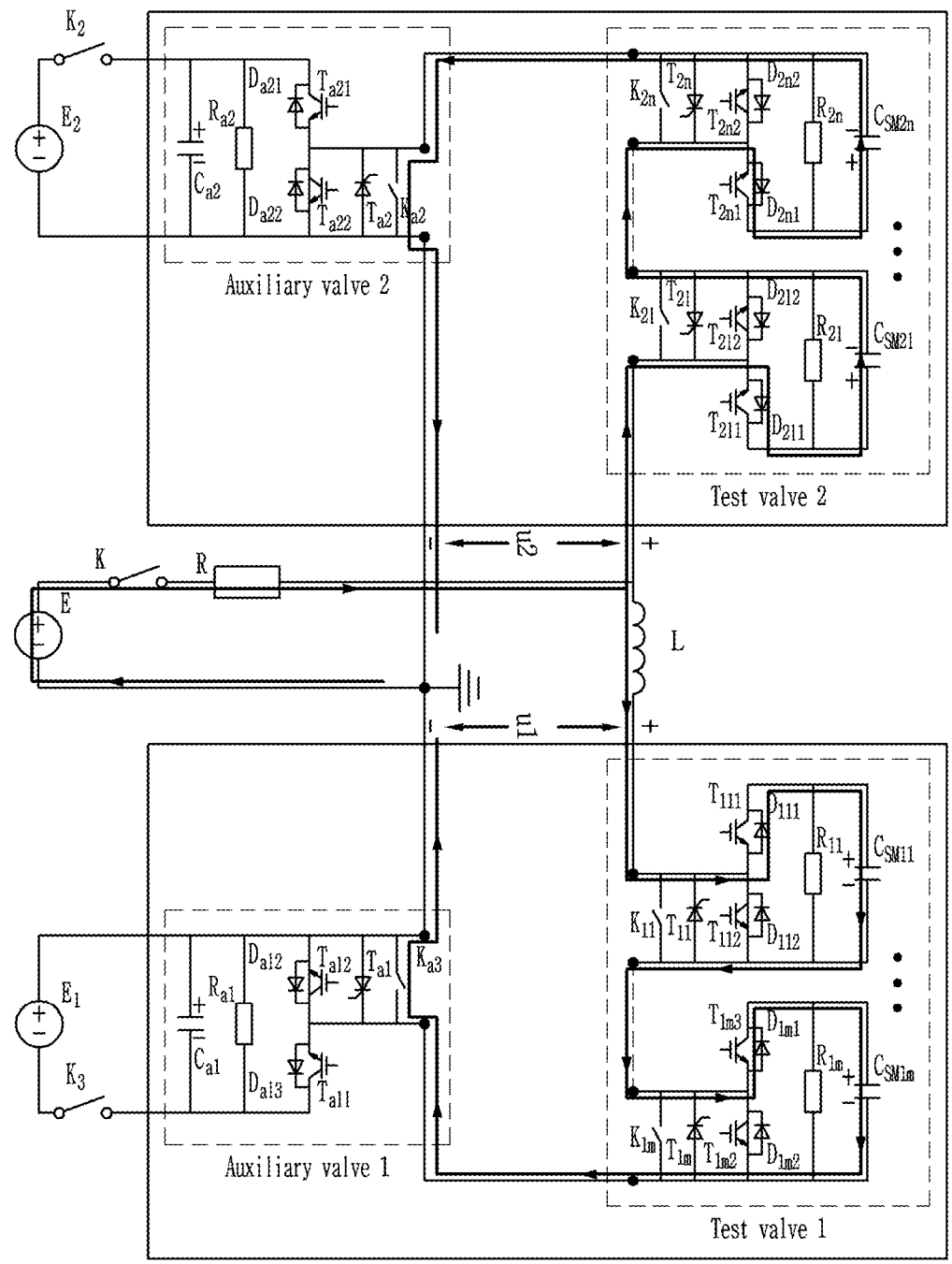
Figure 4:
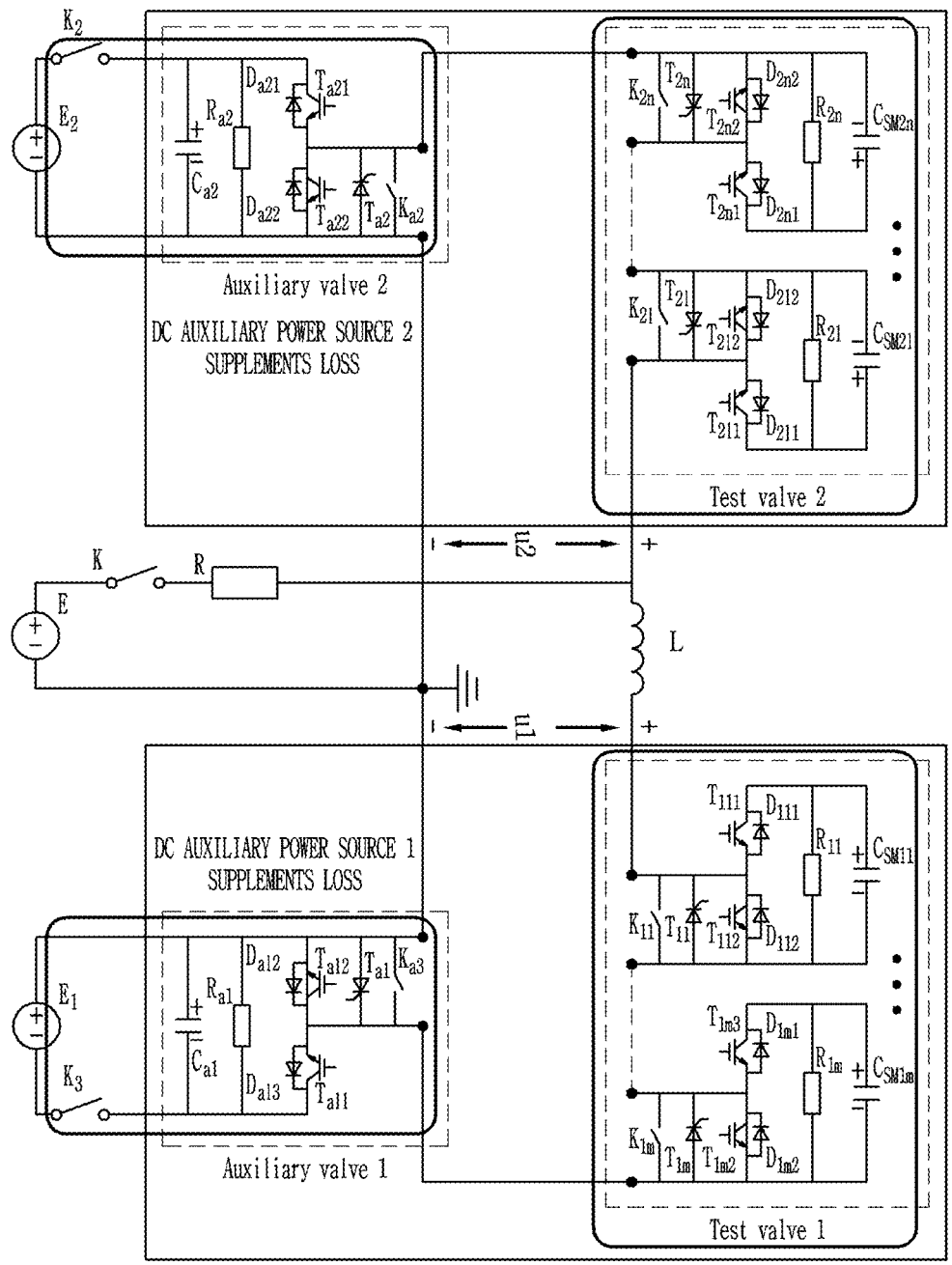
Figure 5:
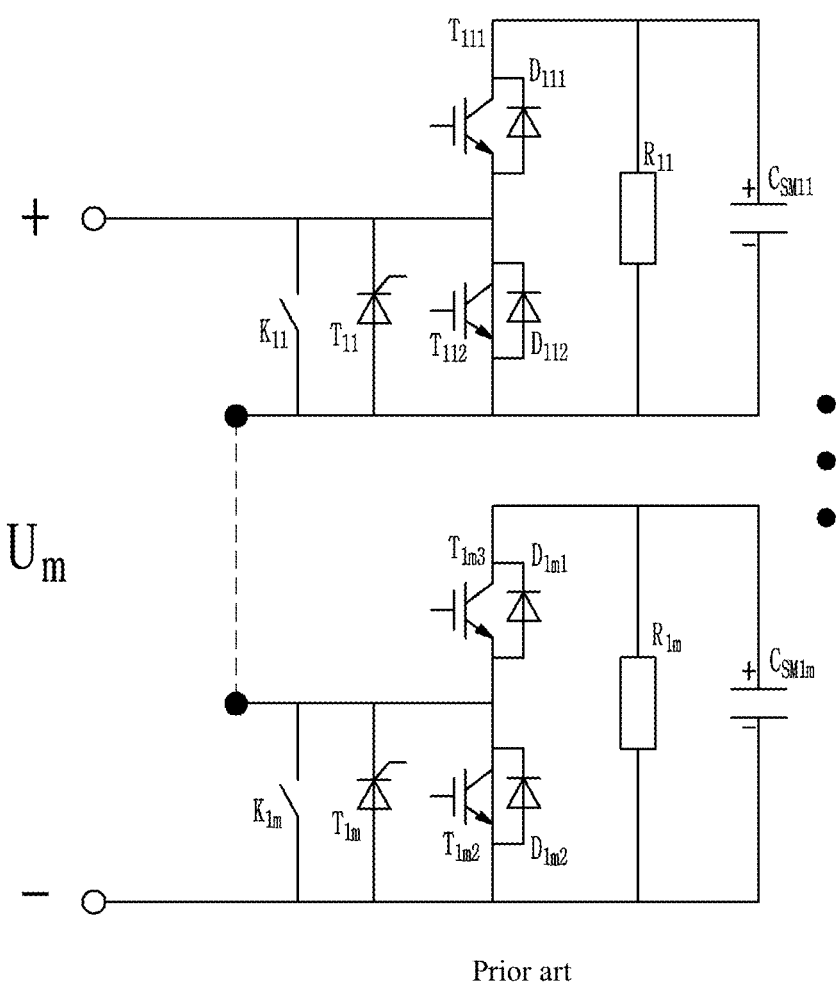
FIG. 5 is a view illustrating a configuration of a test valve, according to the prior art.
Figure 6:
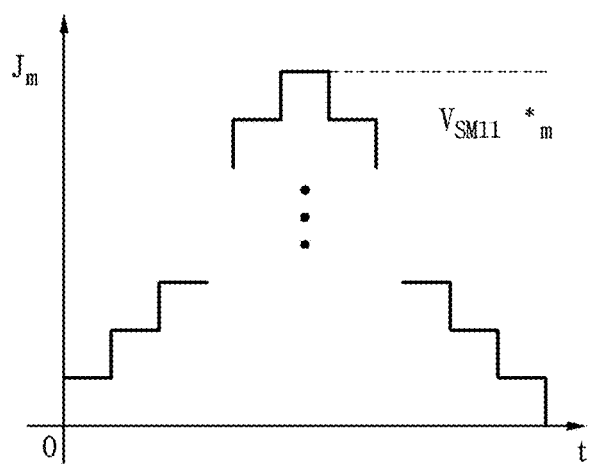
FIG. 6 is a view illustrating an output voltage of a test valve, according to the prior art.
Figure 7:
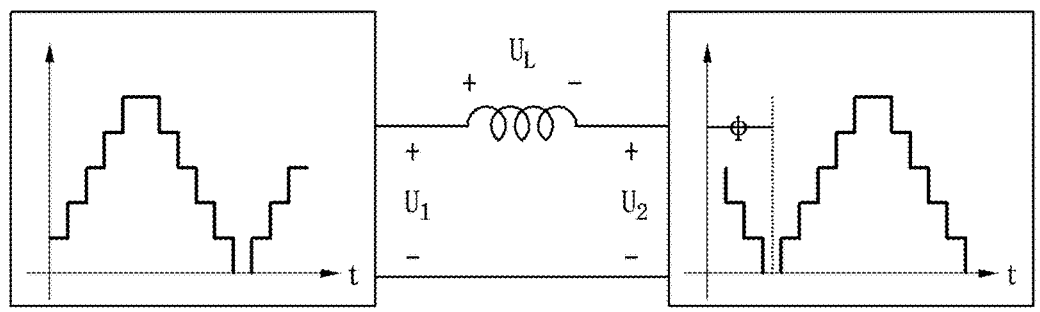
FIG. 7 is a view illustrating an equivalent circuit of a synthetic test circuit, according to the prior art.
Figure 8:
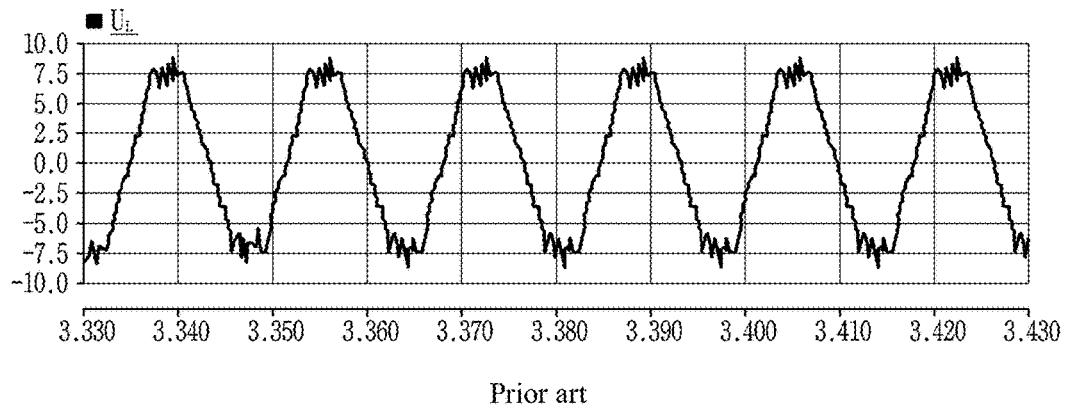
FIG. 8 is a view illustrating a voltage of an inductor, according to the prior art.
Figure 9:
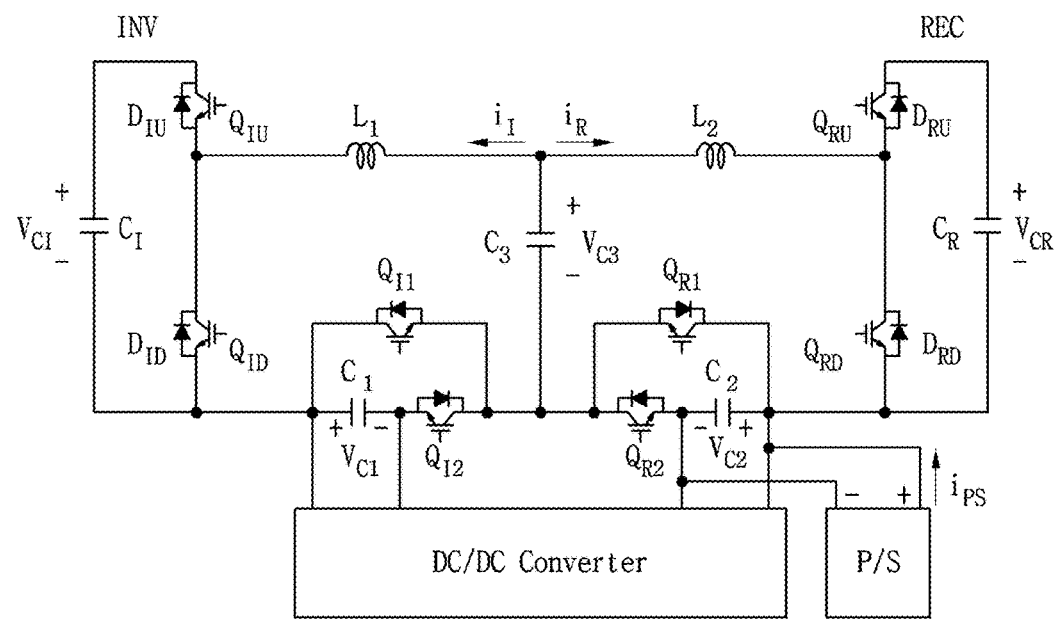
FIG. 9 is a view illustrating a synthetic test circuit for a valve performance test of HVDC in accordance with an embodiment of the present disclosure.
Figure 10:
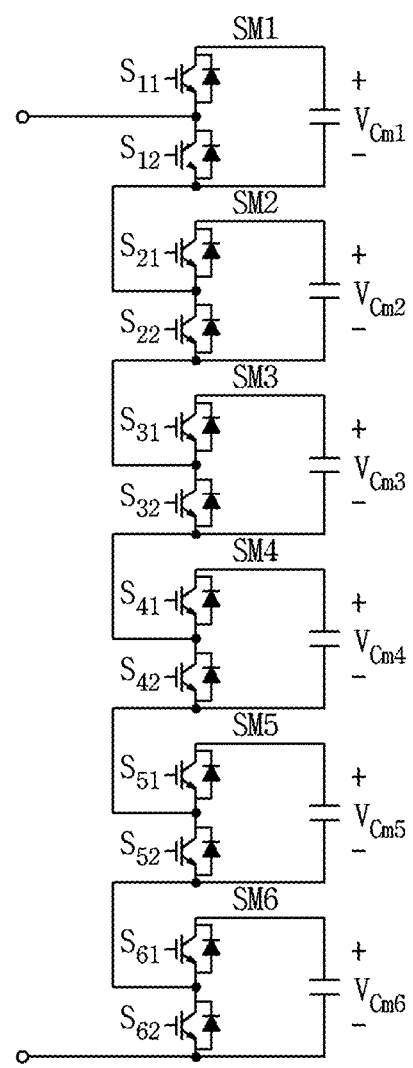
FIG. 10 is a view illustrating a circuit diagram of a specimen to be tested with respect to a synthetic test circuit for a valve performance test of HVDC in accordance with an embodiment of the present disclosure.
Figure 11:
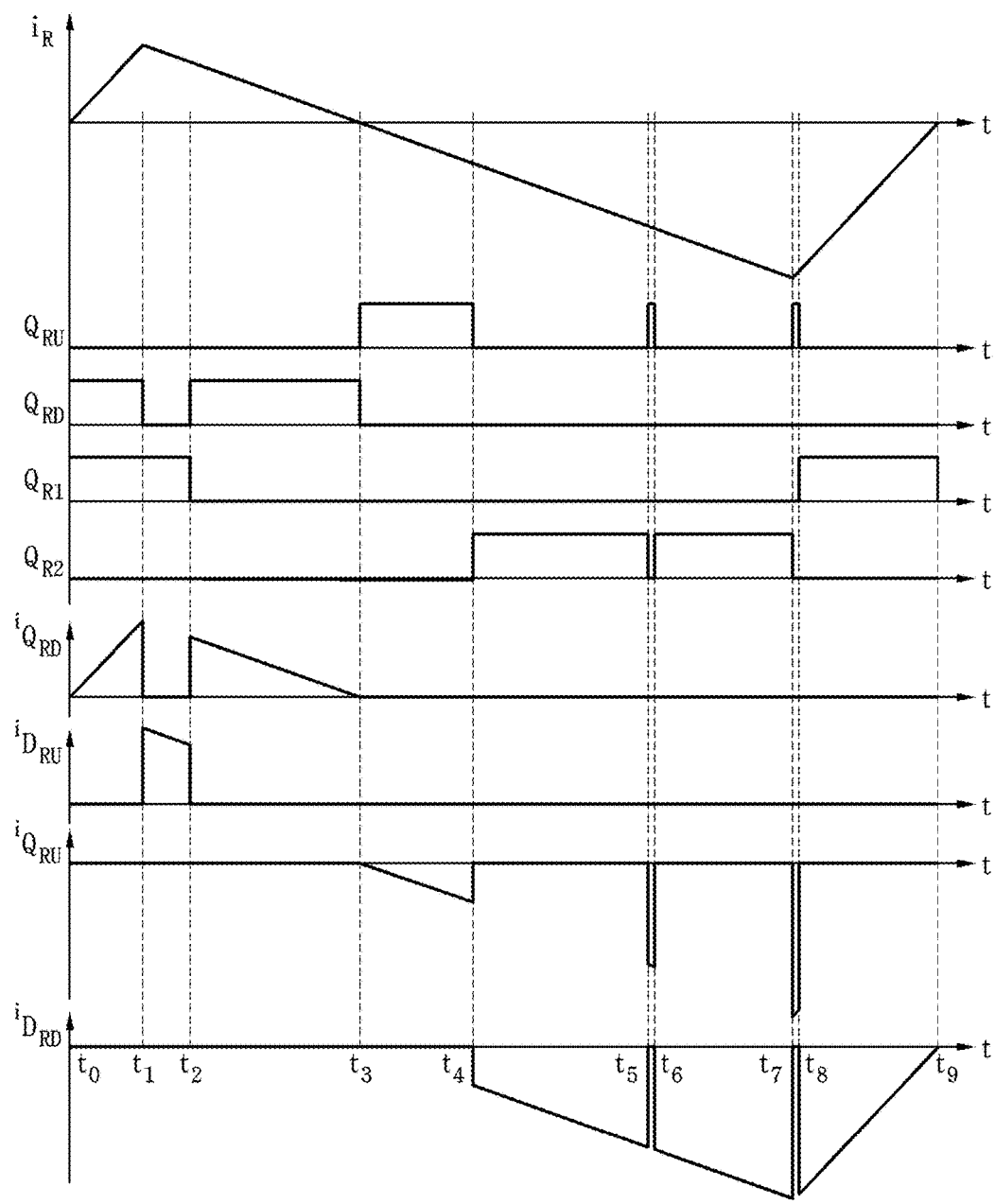
FIG. 11 is a view illustrating switch signals and current waveforms of a rectifier unit sub-module of a synthetic test circuit for a valve performance test of HVDC in accordance with an embodiment of the present disclosure.
Figure 12:
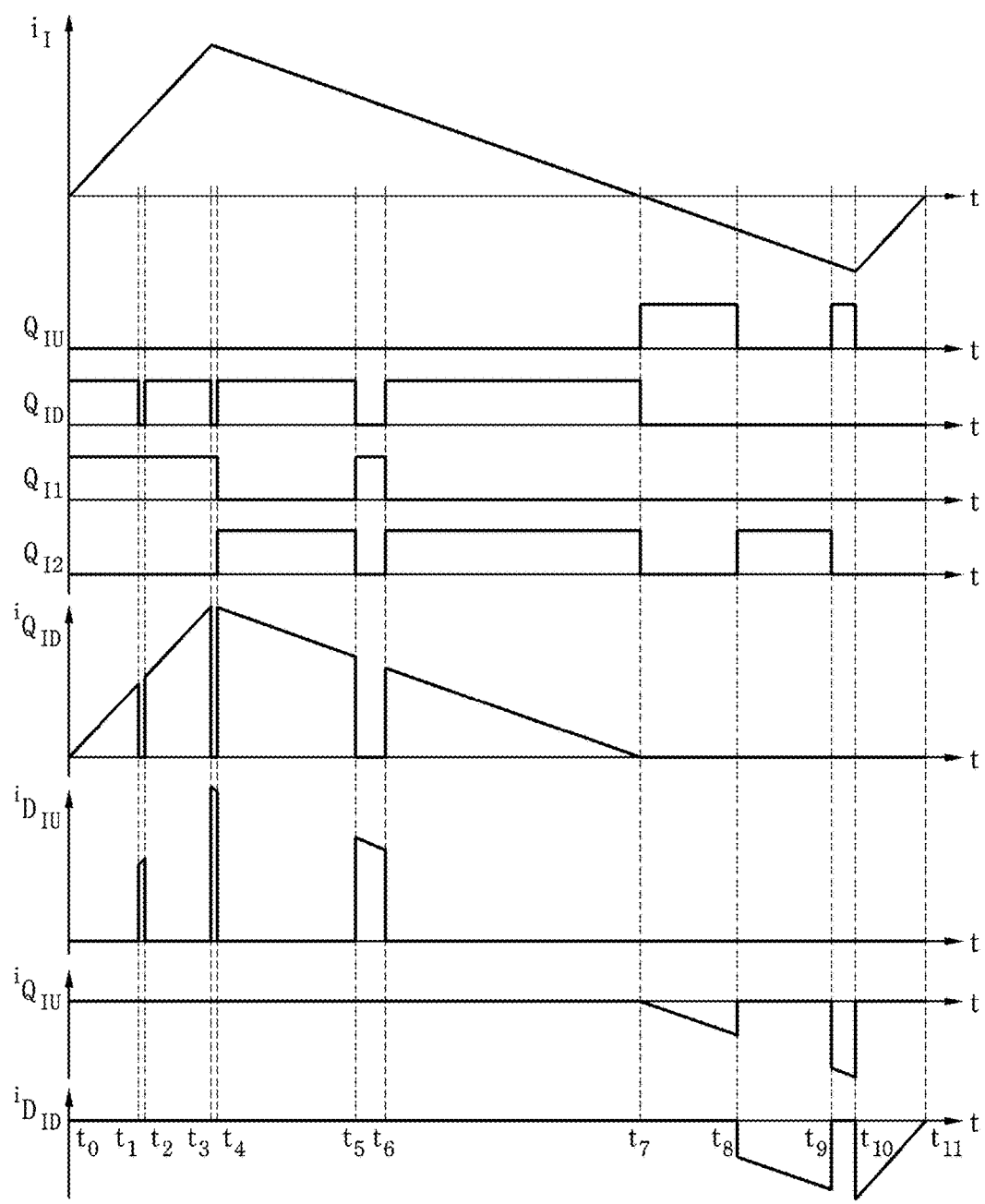
FIG. 12 is a view illustrating switch signals and current waveforms of an inverter unit sub-module with respect to a synthetic test circuit of a valve performance test of HVDC in accordance with an embodiment of the present disclosure.

FIG. 9 is a view illustrating a synthetic test circuit for a valve performance test of HVDC in accordance with an embodiment of the present disclosure, FIG. 10 is a view illustrating a circuit diagram of a specimen to be tested with respect to a synthetic test circuit for a valve performance test of HVDC in accordance with an embodiment of the present disclosure, FIG. 11 is a view illustrating switch signals and current waveforms of a rectifier unit sub-module of a synthetic test circuit for a valve performance test of HVDC in accordance with an embodiment of the present disclosure, and FIG. 12 is a view illustrating switch signals and current waveforms of an inverter unit sub-module with respect to a synthetic test circuit of a valve performance test of HVDC in accordance with an embodiment of the present disclosure.

A power converter unit of an MMC based power source HVDC is configured of several tens or hundreds of IGBT valves (sub-modules) that are serially connected, which needs to test the performance before manufacturing it.

It is not possible to simultaneously test tens or hundreds of IGBT valves that are connected serially in the performance test, and it is described in the international regulation that five (5) or more IGBTs that are serially connected are to be tested. The essential device for such a test is a synthetic test circuit.

Referring to FIG. 9, in a synthetic test circuit for a valve performance test of HVDC in accordance with an embodiment of the present disclosure, a test valve of a rectifier REC unit in the right side is indicated as two IGBTs ($Q_{RU}$-$D_{RU}$ and $Q_{RD}$-$D_{RD}$) and a capacitor $C_R$. In an actual configuration, however, the test valve may be formed of six (6) serially connected IGBT valves (sub-valves) that are same as illustrated in FIG. 10 and it may correspond to a specimen to be tested. Further, a unit indicated as an inverter INV in the left side is also same with the rectifier REC unit and corresponds to a specimen to be tested, too.

Since a characteristic of the IGBT valve configuring the power source HVDC when it operates at a rectifier REC mode is different from that when it operates at an inverter INV mode, the test is needed in each operation mode. However, some embodiments of the present disclosure may provide a structure with which both operation modes can be tested simultaneously.

Referring to FIG. 9, two serially connected inductors $L_1$ and $L_2$ that exist between the inverter INV unit and the rectifier REC unit have the same value and get involved in a current flowing. A capacitor $C_3$ interposed therebetween is connected to a contact between the inductors $L_1$ and $L_2$, which serves to treat a current ripple of the inductors $L_1$ and $L_2$. Four IGBTs ($Q_{I1}$, $D_{I2}$, $Q_{R1}$ and $D_{R2}$) and two capacitors ($C_1$ and $C_2$) at the lower stage serve to bypass a DC component of the current flowing through the $L_1$ and $L_2$, and this process is performed through the DC/DC converter. An external power applied to perform the operation in FIG. 9 may be supplied by a P/S (Power Supply).

That is, according to some embodiments of the present disclosure, there is included a resonance circuit comprising a first test valve to test an operation of an inverter mode and a second test valve to test an operation of a rectifier mode. Further, the P/S supplies the resonance circuit with an operating power. In detail, the P/S may supply the first and second test valves configuring the resonance circuit with an operating power. The first and second test valves may include a plurality of serially connected sub-modules, and each sub-module may include a plurality of IGBTs and a capacitor. The first test valve may be an inverter INV unit, and the second test valve may be a rectifier REC unit.

The sub-modules included in the first and second test valves each may include two (2) serially connected IGBTs, and a capacitor connected to the IGBTs in parallel.

The first test valve has an end connected to the first inductor $L_1$ and the other end connected to the first auxiliary valve. The second test valve has an end connected to the second inductor $L_2$ and the other end connected to the second auxiliary valve.

The first inductor $L_1$ is connected between IGBTs of the first test valve and the first auxiliary valve is connected between the IGBT and a capacitor of the first test valve. The second inductor $L_2$ is connected between IGBTs of the second test valve and the second auxiliary valve is connected between the IGBT and a capacitor of the second test valve.

The first auxiliary valve may include two (2) IGBTs ($Q_{11}$ and $Q_{12}$) and a capacitor $C_1$, the IGBT ($Q_{12}$) and the capacitor $C_1$ are connected serially, and the IGBT ($Q_{11}$) is connected to the other IGBT ($Q_{f2}$) and the capacitor $C_1$ in parallel. The IGBT ($Q_{f1}$) is connected in antiparallel to the other IGBT ($Q_{f2}$).

Further, the second auxiliary valve may include two (2) IGBTs ($Q_{f1}$ and $Q_{f2}$) and a capacitor $C_2$, the IGBT ($Q_{R2}$) and the capacitor $C_2$ are connected serially, and the IGBT ($Q_{R1}$) is in parallel connected to the other IGBT ($Q_{R2}$) and the capacitor $C_2$. The IGBT ($Q_{R1}$) is connected in antiparallel to the other IGBT ($Q_{R2}$).

The first inductor $L_1$ is serially connected to the second inductor $L_2$, and the first auxiliary valve is serially connected to the second auxiliary valve.

One end of the first capacitor $C_3$ is connected to a contact between the first inductor $L_1$ and the second inductor $L_2$, and the other end of the first capacitor $C_3$ is connected to a contact between the first auxiliary valve and the second auxiliary valve.

The DC/DC converter is connected to both ends of the capacitors $C_1$ and $C_2$ included in the first and second auxiliary valves, so that it serves to bypass a DC offset current.

Further, the P/S (Power Supply) is connected to both ends of the capacitor $C_2$ included in the second auxiliary valve, so that it serves to charge a test valve and an auxiliary valve at an initial start-up operation and compensate for a power loss at a normal operation. The P/S (Power Supply) may charge the capacitors $C_1$ and $C_2$, the first capacitor $C_3$ and the capacitors $C_1$ and $C_R$, that are included in the first and second auxiliary valves through a switching control.

Such a synthetic test circuit may be controlled by a control system (not illustrated), which controls switch on/off according to a set operation method to test operations of it on a rectifier mode and a inverter mode.

Referring to FIG. 11, switch signals and current waveforms of a test valve and an auxiliary valve of a rectifier REC unit are as follows. Such conditions as following expressions are required in order to similarly simulate a current waveform flowing through a sub-module when actually operating a voltage source HVDC system.

$$V_{C2} = V_{C1} = V_{CR} = V_{C1}$$

$$V_{C3} = \frac{3}{4} \times V_{C2}$$

a. Mode 1 ($t_0 \le t < t_1$)

When turning on $Q_{RD}$ and $Q_{R1}$, the rectifier input current $i_R$ rises as follows.

$$i_R = \frac{V_{C3}}{L_2} \times t$$

Here, the voltage drop in an ON state of the IGBT valve is ignored and it is assumed that all components are ideal, hereinafter. At $t=t_1$, $Q_{RD}$ is turned off.

b. Mode 2 ($t_1 \le t < t_2$)

When turning off $Q_{RD}$, the current flowing through $Q_{RD}$ starts to flow through $D_{RU}$ and the magnitude of the current is as follows. Here, $i(t_1)$ is an instantaneous value of the current flowing at a time $$i_R = i_{DRU} = i(t_1) + \frac{(V_{C3} - V_{CR})}{L_2} \times t = i(t_1) - \frac{V_{CR}}{4L_2} \times t$$

c. Mode 3 ($t_2 \le t < t_3$)

At $t=t_2$, $Q_{R1}$ is turned off and $Q_{RD}$ is turned on. Then, the current starts to flow along such a route as $C_3 \rightarrow L_2 \rightarrow Q_{RD} \rightarrow C_2 \rightarrow D(Q_{R2}) \rightarrow C_3$ and the magnitude of it is as follows.

$$i_R = i_{QRD} = i(t_2) + \frac{(V_{C3} - V_{C2})}{L_2} \times t = i(t_2) - \frac{V_{C2}}{4L_2} \times t$$

When such current decreases to 0, $Q_{RD}$ is turned off.

d. Mode 4 ($t_3 \le t < t_4$)

At $t=t_3$, when $Q_{RU}$ is turned on, the current starts to increase along such a route as $C_R \rightarrow Q_{RU} \rightarrow L_2 \rightarrow C_3 \rightarrow D(Q_{R1}) \rightarrow C_R$.

$$i_R = i_{QRU} = i(t_3) + \frac{(V_{C3} - V_{CR})}{L_2} \times t = -\frac{V_{CR}}{4L_2} \times t$$

e. Mode 5 ($t_4 \le t < t_5$)

At $t=t_4$, $Q_{RU}$ is turned off and $Q_{R2}$ is turned on. Then, the current flowing through the $Q_{RU}$ is transferred to the $D_{RD}$ to flow.

$$i_R = i_{DRD} = i(t_4) + \frac{(V_{C3} - V_{C2})}{L_2} \times t = i(t_4) - \frac{V_{C2}}{4L_2} \times t$$

f Mode 6 ($t_5 \le t < t_6$)

At $t=t_5$, when turning off $Q_{R2}$ and turning on $Q_{RU}$, the current moves to $Q_{RU}$, again.

$$i_R = i_{QRU} = i(t_5) + \frac{(V_{C3} - V_{CR})}{L_2} \times t = i(t_5) - \frac{V_{CR}}{4L_2} \times t$$

g. Mode 7 ($t_6 \le t < t_7$)

At $t=t_6$, when turning off $Q_{RU}$ and turning on $Q_{R2}$, the current moves from $Q_{RU}$ to $D_{RD}$.

$$i_R = i_{DRD} = i(t_6) + \frac{(V_{C3} - V_{C2})}{L_2} \times t = i(t_6) - \frac{V_{C2}}{4L_2} \times t$$

h. Mode 8 ($t_7 \le t < t_8$)

At $t=t_7$, when turning off $Q_{R2}$ and turning on $Q_{RU}$, the current moves from $D_{RD}$ to $Q_{RU}$, again.

$$i_R = i_{DRU} = i(t_7) + \frac{(V_{C3} - V_{CR})}{L_2} \times t = i(t_7) - \frac{V_{CR}}{4L_2} \times t$$

i. Mode 9 ($t_8 \le t < t_9$)

At $t=t_8$, when turning off $Q_{RU}$ and turning on $Q_{R1}$, the current becomes as follows.

$$i_R = i_{DRD} = i(t_8) + \frac{V_{C3}}{L_2} \times t$$

When the magnitude of the current becomes 0, $Q_{R1}$ is turned off.

Referring to FIG. 12, switch signals and current waveforms of the test valve and auxiliary valve of the inverter INV unit are as follows. Such conditions as following expressions are required in order to similarly simulate a waveform of a current flowing through a sub-module when actually operating a voltage source HVDC system.

a. Mode 1 ($t_0 \leq t < t_1$)

When turning on $Q_{ID}$ and $Q_{I1}$, the inverter input current $i_I$ rises as follows.

$$i_I = \frac{V_{C3}}{L_1} \times t$$

b. Mode 2 ($t_1 \leq t < t_2$)

At $t=t_1$, when turning off $Q_{ID}$, the current moves from $Q_{ID}$ to $D_{IU}$.

$$i_I = i_{DIU} = i(t_1) + \frac{(V_{C3} - V_{C1})}{L_1} \times t = i(t_1) - \frac{V_{C1}}{4L_1} \times t$$

c. Mode 3 ($t_2 \leq t < t_3$)

At $t=t_2$, when turning on $Q_{ID}$, the current moves from $D_{IU}$ to $Q_{ID}$.

$$i_I = i_{QID} = i(t_2) + \frac{V_{C3}}{L_1} \times t$$

d. Mode 4 ($t_3 \leq t < t_4$)

At $t=t_3$, when turning off $Q_{ID}$, the current moves to $D_{IU}$, again.

$$i_I = i_{DIU} = i(t_3) + \frac{(V_{C3} - V_{C1})}{L_1} \times t = i(t_3) - \frac{V_{C1}}{4L_1} \times t$$

e. Mode 5 ($t_4 \leq t < t_5$)

At $t=t_4$, when turning off $Q_{I1}$ and turning on $Q_{I2}$ and $Q_{ID}$, a reverse voltage is applied to $L_1$ so that the magnitude of the current starts to decrease.

$$i_I = i_{QIU} = i(t_4) + \frac{(V_{C3} - V_{C1})}{L_1} \times t = i(t_4) - \frac{V_{C1}}{4L_1} \times t$$

f. Mode 6 ($t_5 \leq t < t_6$)

At $t=t_5$, when turning off $Q_{ID}$ and $Q_{I2}$, and turning on $Q_{I1}$, the current moves from $Q_{ID}$ to $D_{IU}$.

$$i_I = i_{DIU} = i(t_5) + \frac{(V_{C3} - V_{C1})}{L_1} \times t = i(t_5) - \frac{V_{C1}}{4L_1} \times t$$

g. Mode 7 ($t_6 \leq t < t7$)

At $t=t_6$, when turning off $Q_{I1}$ and turning on $Q_{ID}$ and $Q_{I2}$, the current moves from $D_{IU}$ to $Q_{ID}$.

$$i_I = i_{QID} = i(t_6) + \frac{(V_{C3} - V_{C1})}{L_1} \times t = i(t_6) - \frac{V_{C1}}{4L_1} \times t$$

When the current decreases to 0, $Q_{ID}$ and $Q_{I2}$ are turned off.

h. Mode 8 ($t_7 \leq t < t_8$)

At t=t7, when turning on $Q_{I2}$, $i_I$ starts to increase in the minus (−) direction.

$$i_I = i_{QIU} = i(t_7) + \frac{(V_{C3} - V_{C1})}{L_1} \times t = i(t_7) - \frac{V_{C1}}{4L_1} \times t$$

i. Mode 9 ($t_8 \leq t < t_9$)

At $t=t_8$, when turning off $Q_{IU}$ and turning on $Q_{I2}$, the current moves from $Q_{IU}$ to $D_{ID}$.

$$i_I = i_{DID} = i(t_8) + \frac{(V_{C3} - V_{C1})}{L_1} \times t = i(t_8) - \frac{V_{C1}}{4L_1} \times t$$

j. Mode 10 ($t_9 \leq t < t_{10}$)

At $t=t_9$, when turning off $Q_{I2}$ and turning on $Q_{IU}$, the current moves from $D_{ID}$ to $Q_{IU}$.

$$i_I = i_{QIU} = i(t_9) + \frac{(V_{C3} - V_{C1})}{L_1} \times t = i(t_9) - \frac{V_{C1}}{4L_1} \times t$$

k. Mode 11 ($t_{10} \leq t < t_{11}$)

At $t=t_{10}$, when turning off $Q_{IU}$, the current moves from $Q_{IU}$ to $D_{ID}$.

$$i_I = i_{DID} = i(t_{10}) + \frac{V_{C3}}{L_1} \times t$$

When the current becomes 0, the mode 11 is terminated.

As can be understood from the operations of the rectifier REC unit and the inverter INV unit that are described above, the synthetic test circuit for a valve performance test of HVDC in accordance with some embodiments of the present disclosure may embody a synthetic test circuit that may simulate an actual situation as much as possible by enabling a DC offset to be added.

That is, as can be seen from the current $i_R$ in FIG. 11 and the current $i_I$ in FIG. 12, the first test valve may have a positive DC current offset and the second test valve may have a negative DC current offset.

Since an actual voltage source HVDC may have an offset current in the operation depending on a rectifier mode or an inverter mode, some embodiments of the present disclosure may embody a synthetic test circuit similar to that in such an actual situation, capable of securing the reliability.

Further, the synthetic test circuit for a valve performance test of HVDC in accordance with some embodiments of the present disclosure may enable the current of the valve to be switched in a PWM scheme while controlling the pulse width within one (1) period, which is very similar to an actual situation, thereby maximizing a validity of the test circuit.

In the synthetic test circuit for a valve performance test of HVDC in accordance with some embodiments of the present disclosure, since the power supplied to the synthetic test circuit only needs to provide the loss on the circuit, such as a switch loss of the IGBT valve and a line loss, it is possible to perform a high-power test of an actual capacity using a minimal power that is less than 1% of an actual power. Accordingly, there is an advantage that power consumption is very little in the test facility.

The synthetic test circuit for a valve performance test of HVDC in accordance with some embodiments of the present disclosure may simultaneously test specimens to be tested in the inverter unit and the rectifier unit, thereby contributing to an enhanced productivity.

Some embodiments of the present disclosure may provide a novel configuration of a synthetic test circuit for a valve performance test of HVDC.

Further, some embodiments of the present disclosure may provide a synthetic test circuit for a valve performance test of HVDC, which is capable of providing a current including a DC offset.

Further, some embodiments of the present disclosure may provide a configuration of a synthetic test circuit for a valve performance test of HVDC, which is capable of switching several times within a period.

Further, some embodiments of the present disclosure may provide a synthetic test circuit for a valve performance test of HVDC, which consumes a little power and is capable of simultaneously testing the specimens to be tested of an inverter unit and a rectifier unit.

Hereinbefore, although the present disclosure is described with reference to embodiments, they are only exemplary illustrations and are not to limit the disclosure. It will be clearly understood by those skilled in the art that various modifications and applications not illustrated above are possible without departing basic sprits of the embodiments. For example, each constitutional component illustrated in detail in the embodiments may be embodied in a modified form. Further, differences related to such modifications and applications should be construed to be included in scopes of the present disclosure defined by appended claims.

What is claimed is:

1. A synthetic test circuit for a valve performance test of HVDC, comprising:
   a resonance circuit comprising a first test valve configured to test an operation of an inverter mode and a second test valve configured to test an operation of a rectifier mode;
   a power supply (P/S) configured to provide the resonance circuit with an operating voltage; and
   a DC/DC converter configured to bypass a DC offset current of the resonance circuit,
   wherein each of the first and second test valves comprises a plurality of sub-modules, each sub-module includes a plurality of IGBTs and a capacitor,
   wherein a current flowing in a sub-module disposed in the first test valve includes a positive DC current offset, and
   wherein a current flowing in a sub-module disposed in the second test valve includes a negative DC current offset.

2. The synthetic test circuit of claim 1,
   wherein the resonance circuit comprises a first inductor (L1) and a second inductor(L2) that are serially connected between the first and second test valves, a first auxiliary valve and a second auxiliary valve that are serially connected between the first and second test valves, and a first capacitor(C3) whose one end is connected to a contact between the first inductor(L1) and the second inductor(L2), and whose other end is connected to a contact between the first auxiliary valve and the second auxiliary valve.

3. The synthetic test circuit of claim 2, wherein the first inductor is connected between IGBTs of the first test valve, the second inductor is connected between IGBTs of the second test valve, the first auxiliary valve is connected between the IGBT and the capacitor of the first test valve, and the second auxiliary valve is connected between the IGBT and the capacitor of the second test valve.

4. The synthetic test circuit of claim 2, wherein the sub-modules comprised in the first and second test valves each comprise two serially connected IGBTs, and a capacitor connected to the IGBTs in parallel.

5. The synthetic test circuit of claim 2, wherein the first auxiliary valve comprises a first IGBT, and a second IGBT and a capacitor that are connected to the first IGBT in parallel and are serially connected with each other, and
   wherein the second auxiliary valve comprises a third IGBT, and a fourth IGBT and a capacitor that are connected to the third IGBT in parallel and are serially connected with each other.

6. The synthetic test circuit of claim 5, wherein the DC/DC converter is connected to both ends of the capacitor comprised in the first auxiliary valve and to both ends of the capacitor comprised in the second auxiliary valve.

7. The synthetic test circuit of claim 5, wherein the power supply is connected to both ends of the capacitor comprised in the second auxiliary valve to charge the test valve and the auxiliary valve.

8. The synthetic test circuit of claim 5, wherein the first and second IGBTs are connected in antiparallel, and the third and fourth IGBTs are connected in antiparallel.

9. The synthetic test circuit of claim 2, wherein the first and second inductors have the same value.

10. The synthetic test circuit of claim 1, wherein the power supply provides the first and second test valves with an operating voltage.

* * * * *